United States Patent [19]
Chu

[11] Patent Number: 6,077,741
[45] Date of Patent: Jun. 20, 2000

[54] METHOD OF FABRICATING DRAM CAPACITOR

[75] Inventor: Hsin-Kun Chu, Hsinchu Hsien, Taiwan

[73] Assignee: United Integrated Circuits Corp., Hsinchu, Taiwan

[21] Appl. No.: 09/286,353

[22] Filed: Apr. 5, 1999

[30] Foreign Application Priority Data

Mar. 5, 1999 [CN] China ................................. 88103370

[51] Int. Cl.⁷ .............................................. H01L 21/8242
[52] U.S. Cl. .......................................................... 438/253
[58] Field of Search ............................ 438/3, 238, 240, 438/250–256, 381, 393–399

[56] References Cited

U.S. PATENT DOCUMENTS 5,981,337 11/1999 Chuang ..................................... 438/253
6,015,734 11/1999 Huang et al. ............................. 438/253

*Primary Examiner*—Jey Tsai
*Attorney, Agent, or Firm*—Jiawei Huang; J.C. Patents

[57] ABSTRACT

A method of fabricating a DRAM capacitor. After forming a node contact opening in a dielectric layer on the substrate, a conductive layer having an annulus hollow is formed. A recess is formed on the conductive layer and a spacer is formed on the sidewall of the spacer, after which the annulus hollow is filled with an oxide layer. A photoresist layer for defining the capacitor region is formed. The etching stop layer, the oxide layer, and the spacer are removed to form the bottom electrode. Then, the dielectric layer and the upper electrode are formed in sequence.

13 Claims, 6 Drawing Sheets

METHOD OF FABRICATING DRAM CAPACITOR

CROSS-REFERENCE TO RELATED APPLICATION

This application claims the priority benefit of Taiwan application serial no. 88103370, filed Mar. 05, 1999, the full disclosure of which is incorporated herein by reference.

BACKGROUND OF THE INVENTION

1. Field of Invention

The present invention relates to a method of fabricating a DRAM capacitor. More particularly the present invention relates to a method for forming a bottom electrode of the capacitor.

2. Description of Related Art

The memory function of a Dynamic Random Access Memory (DRAM) is controlled via a voltage of a bit line provided on the source region of a Metal Oxide Semiconductor (MOS) transistor. This allows the movement of the internal charges of the capacitor to read and write data. In such a case the internal charges of capacitor are in a non-equilibrium state. Since it is easy to lose charges and to produce leakage current in the non-equilibrium state. It is necessary to refresh the capacitor with a certain frequency to compensate for the charge loss in a timely manner, in order to prevent read/write signal errors caused by current loss in the capacitor.

Conventionially the frequency for refreshing a normal capacitor depends on the number of charges that can be stored in the capacitor. The more charges that the capacitor can store, the smaller is the influence by the noise signal in the read/write signal transmission. Meanwhile, the frequency for refreshing can also be lowered to improve the DRAM read/write speed. Thus, the capability to increase the charge storage in the capacitor has become a development trend.

In addition to an improvement in the conducting material and dielectric layer of the capacitor, an increase in the surface area of the capacitor also allows greater charge storage in the capacitor. The design of the well known bottom electrode of capacitor having a cylinder structure has been developed to increase the surface area of the capacitor. By forming a hollow in the conductive layer the surface area of the bottom electrode of capacitor is increased. The surface area of the sidewall of the hollow is the increased surface area of the bottom electrode of capacitor. To increase the surface area of the bottom electrode of capacitor more effectively, it is necessary to have a greater thickness for forming the conductive layer of the bottom electrode of capacitor. Since the conductive layer is conventionally formed by deposition, it takes quite a long time to deposit thicker conductive layer. This slows down the whole process of the capacitor. Additionally, due to the greater thickness of the conductive layer, cylinder structures of the bottom electrode of the capacitor are slimmer structures after hollows are formed. These slimmer structures are easily broken in the subsequent processes, influencing the quality of the capacitor. Thus, this leads to a reduction in yield.

FIG. 1 is a cross-sectional diagram showing a bottom electrode structure for a capacitor having a cylinder structure fabricated according to the prior art.

Referring to FIG. 1, there are a dielectric layer 102 on a substrate 100, and a contact opening 104 in the dielectric layer 102. A conductive layer fills the contact opening 104 and covers the dielectric layer 102. There are hollows 108 in the conductive layer 106, so that the conductive layer 106 is showing the cylinder structure. Since the thickness of the conductive layer 106 is relative to the surface area of bottom electrode, the thicker the conductive layer 106, the more the surface area of the bottom electrode is increased by the cylinder structure. In order to yield a larger surface area of the bottom electrode, the conductive layer 106 is often very thick, and may be as thick as about 800 Å. As a result it takes a long time to form the conductive layer 106 by deposition. This lengthens the capacitor process time, which reduces production efficiency.

Furthermore, when the thickness of the conductive layer 106 reaches a certain extent and after the hollow 108 is formed in the conductive layer 106 the cylinder structure of the conductive layer 106 is quite slim. The slim cylinder structure is easily broken by stress in the subsequent processes. This results a poor quality capacitor, leading to a yield reduction.

SUMMARY OF THE INVENTION

Therefore, the present invention provides a method for fabricating DRAM capacitor. A contact opening is formed in the dielectric layer on the substrate. A conductive layer covering the dielectric layer and filling the contact opening is then deposited. Annulus hollows are formed in the conductive layer and the annulus hollows are filled with an oxide layer. A recess is formed in the conductive layer, and a spacer is formed on the sidewall of the recess. After a photoresist layer is formed on the conductive layer, an etching step is performed to define a capacitor region having a hollow. The photoresist layer, the oxide layer, and the spacer are removed to form a bottom electrode of capacitor. The dielectric layer and the upper electrode are then formed in sequence, completing the process of DRAM capacitor.

There are two methods of forming the bottom electrode. One of which is to form a photoresist covering only the oxide layer and the conductive layer enclosed by the oxide layer. After the oxide layer is removed, the hollow is connected to the annulus hollows, forming the bottom electrode with a double cylinder structure. Another method is to form the photoresist layer covering the oxide layer, the conductive layer enclosed by the oxide layer, and the conductive layer encompassing part of the oxide layer. A hollow is formed to isolate part of the conductive layer between the oxide layer. After the oxide layer is removed, there is still part of the conductive layer remaining outside the annulus hollow, forming the bottom electrode of with a triple cylinder structure.

Since the bottom electrodes with double cylinder and triple cylinder structures have larger surface areas, the conductive layer does not need a great thickness. The time it takes to form the conductive layer by deposition can also be greatly reduced, thus the capacitor process can be accelerated. Furthermore, as the height of cylinder structure of the bottom electrode formed can be reduced, the cylinder structure of the bottom electrode will not be broken due to excessive slimness. Thus, the quality of the capacitor is improved and the process yield is raised.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
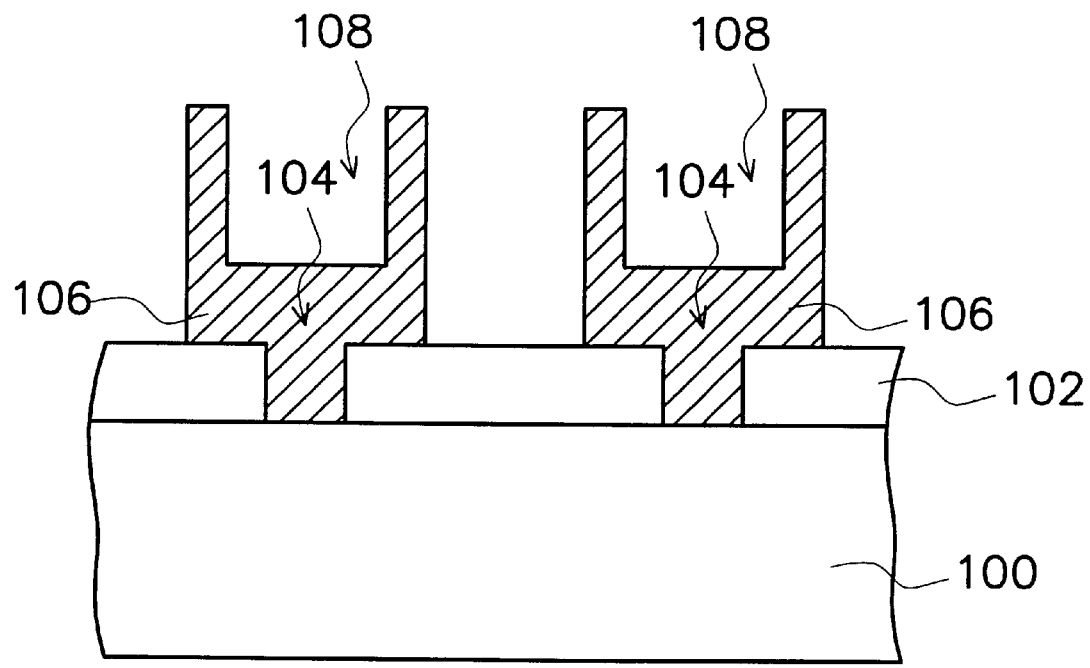
FIG. 1 is a cross-sectional diagram showing a capacitor bottom electrode structure with a cylinder structure fabricated according to the prior art.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 2A:
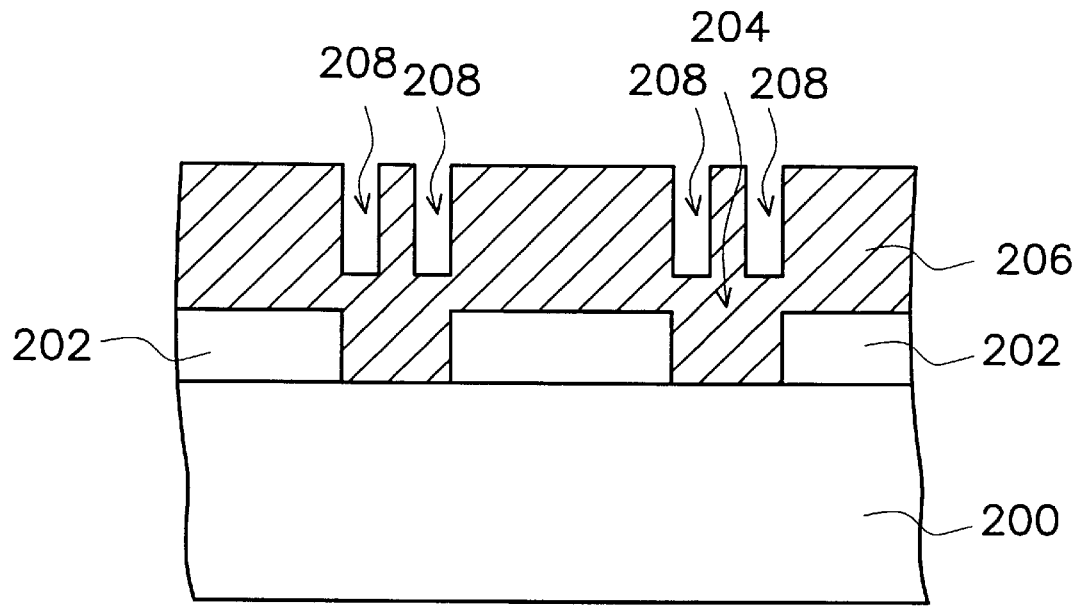
FIGS. 2A to 2E are cross-sectional diagrams showing the process flow for fabricating a DRAM capacitor according to the first embodiment of the invention.

Referring to FIG. 2A a node contact opening 204 which exposes a part of the substrate 200 is formed in a dielectric layer 202 on the substrate 200. A conductive layer 206 covering the substrate 200 and the dielectric layer 202 and filling the node contact opening 204 is formed. A part of the conductive layer 206 is removed, so that an annulus hollow 208 which encompasses a core of the conductive layer 206 is formed in the conductive layer 206 above the contact opening 204. The method of forming the annulus hollow 208, such as defining the position of the annulus hollow 208 by photolithography and partially etching is performed to control the depth of the annulus hollow 208. The thickness of the conductive layer 206 in this case is about 3500–4500 Å and the material in this case comprises polysilicon. Preferably, the annulus hollow 208 has a bottom surface level higher than a surface level of the dielectric layer 202.

Figure 2B:
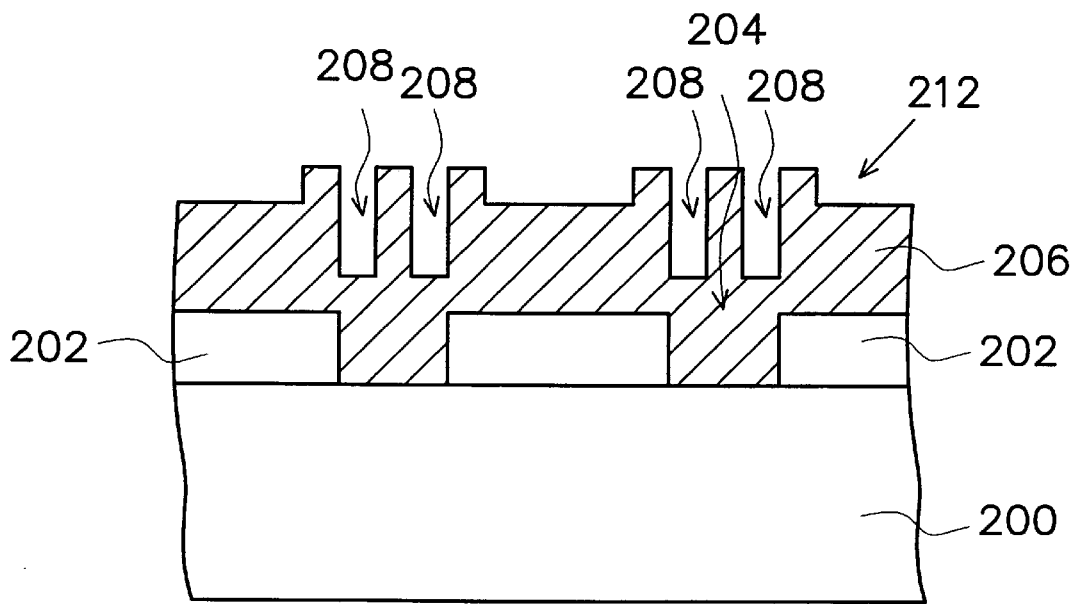

A photoresist layer (not shown) is formed to cover the core conductive layer 206, the annulus hollow 208, and part of the conductive layer 206 that encloses the annulus hollow 208. Referring to FIG. 2B, anisotropic etching is performed to remove a part of the conductive layer 206, so that a certain thickness of the conductive layer 206 uncovered by the photoresist layer is removed to form a recess 212. A ring of the conductive layer 206 encompassing the annulus hollow 208 and the core of the conductive layer 206 is exposed after the photoresist layer is removed. The core and the ring of the conductive layer outstand a surface level of the conductive layer 206 under the recess 212. The core of the conductive layer 206 is encompassed by the annulus hollow 208, while the annulus hollow 208 is encircled by the ring conductive layer 206.

Figure 2C:
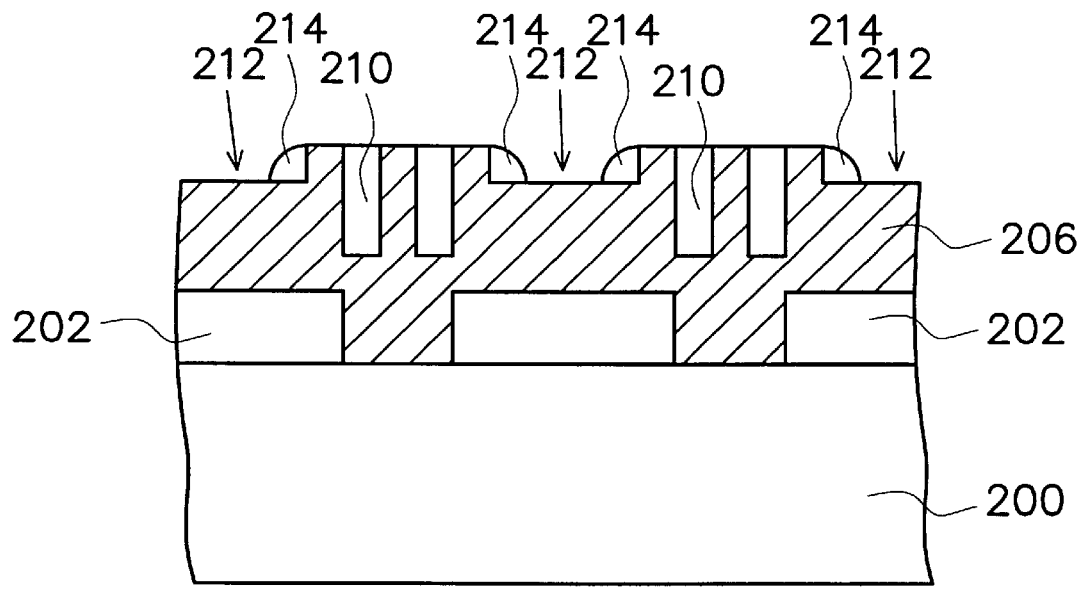

An oxide layer is formed to cover the conductive layer 206 and to fill the recess 212 as well as the annulus hollow 208. To remove the excessive oxide layer over the conductive layer 206, an etch back is performed, so that a spacer 214 is formed on a sidewall of the ring conductive layer 206. This is shown in FIG. 2C.

Figure 2D:
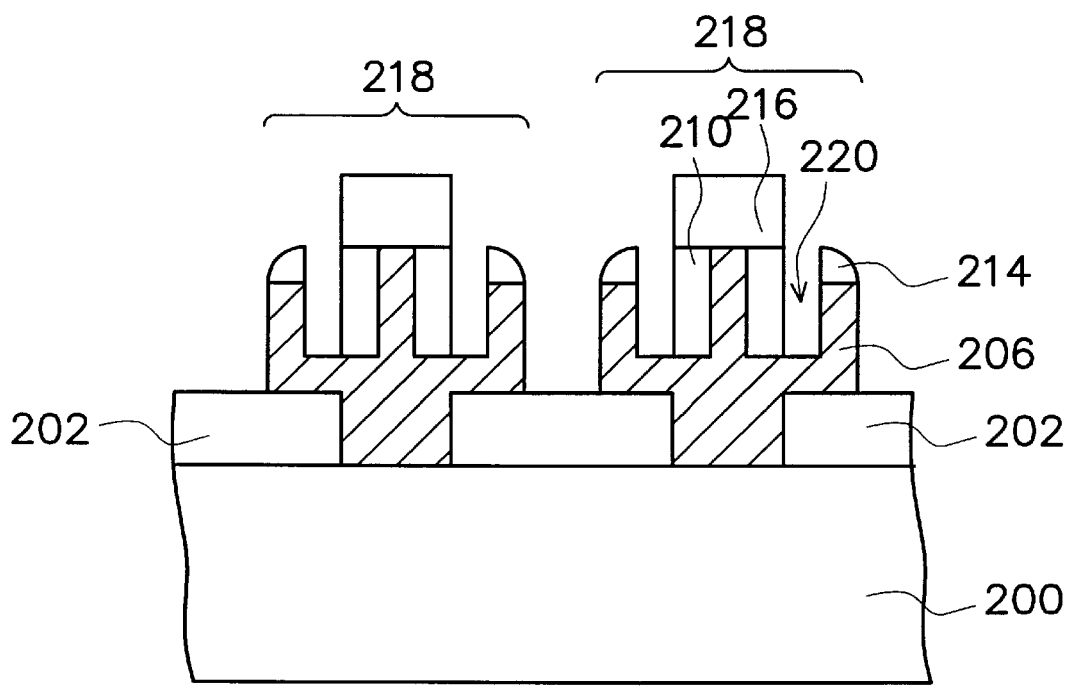

Referring to FIG. 2D, a photoresist layer 216 is formed to cover the oxide layer 210 in the annulus hollow and the core of the conductive layer 206. With the photoresist layer 216 and the spacer 214 serving as masks, an etching step is further performed to define a capacitor region 218. The capacitor region 218 comprises a hollow 220 and the remaining conductive layer 206. Since the photoresist layer 216 only covers the oxide layer 210 and the core of the conductive layer 206, the hollow 220 is formed to enclose the oxide layer 210. In this case, an anisotropic etching is performed on the conductive layer 206 with a plasma made of $Cl_2$-based and HBr-based gases, so that part of the dielectric layer 202 not covered by the conductive layer 206 is exposed.

Figure 2E:
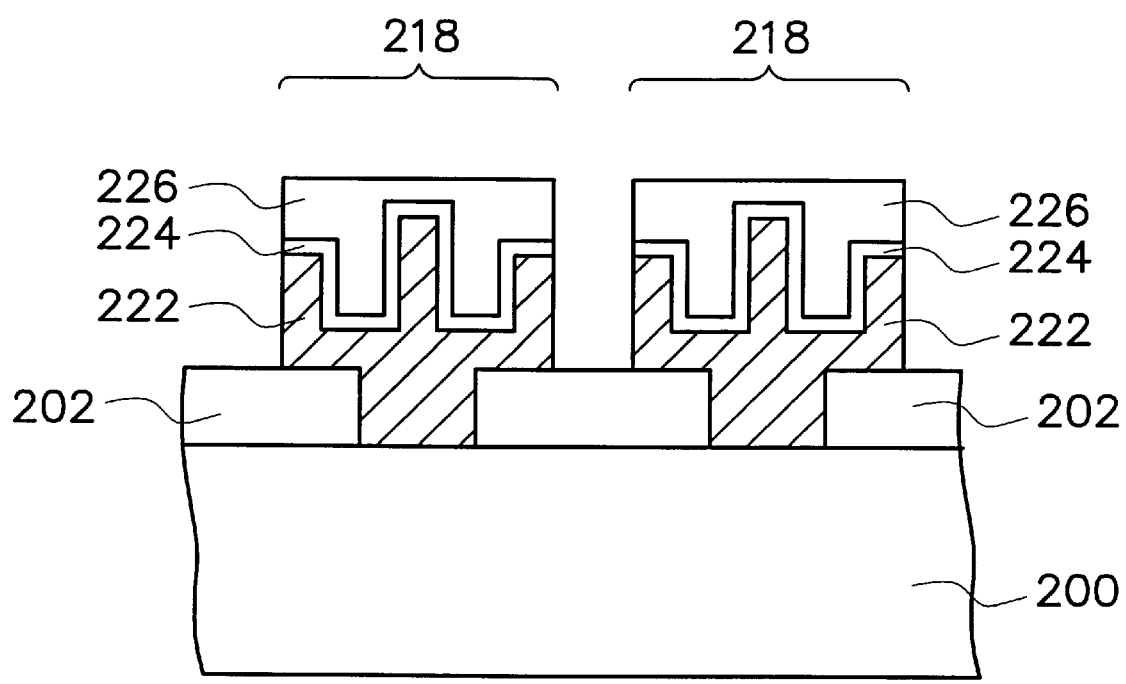

The photoresist layer 216, the oxide layer 210, and the spacer 214 are removed to form the bottom electrode 222, which resembles a fork-like structure in cross-section. Referring to FIG. 2E, the bottom electrode 222 has a multiple concentric cylinder structure. A dielectric layer 224 and a top electrode 226 are then formed on the bottom electrode 292 in sequence.

Second Embodiment

Figure 3A:
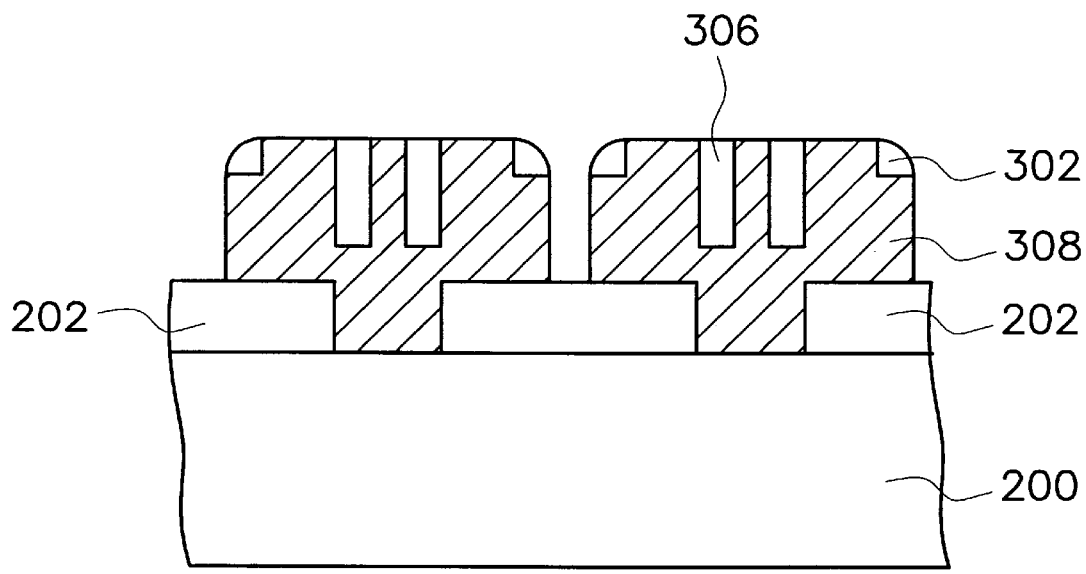
FIGS. 3A to 3D are cross-sectional diagrams showing the process flow for fabricating a DRAM capacitor according to the second embodiment of the invention.

Similar to the first embodiment a conductive layer 308 is formed on the dielectric layer 202 to fill the opening. The conductive layer 308 is etched to form the configuration as shown in FIG. 2A and FIG. 3A. That is, an annulus hollow 306 is formed in the conductive layer 308 above the opening. A photoresist wider than the one used in the previous embodiment (not shown) is formed to cover a part of the conductive layer 308 and the annulus hollow 306. Referring to both FIG. 3A and FIG. 2B, the conductive layer 308 is etched with the photoresist as a mask. Here, the conductive layer 308 comprises a recess, a ring and a core, wherein the ring conductive layer 308 and the core conductive layer 308 have a surface level higher than that of the recess. The core conductive layer 308 is encompassed by the annulus hollow 306, while the annulus hollow 306 is encircled by the ring conductive layer 308. Referring to FIG. 3A and FIG. 2C, a part of the recess of the conductive layer 308 is removed until the dielectric layer 202 is exposed. Therefore, spacers 302 are formed on a sidewall of the ring conductive layer 308 on the recess and an oxide layer is formed to fill the annulus hollow 306. It is noted that the distance between the spacer 302 and the adjacent oxide layer 306 is much larger in the second embodiment.

Figure 3B:
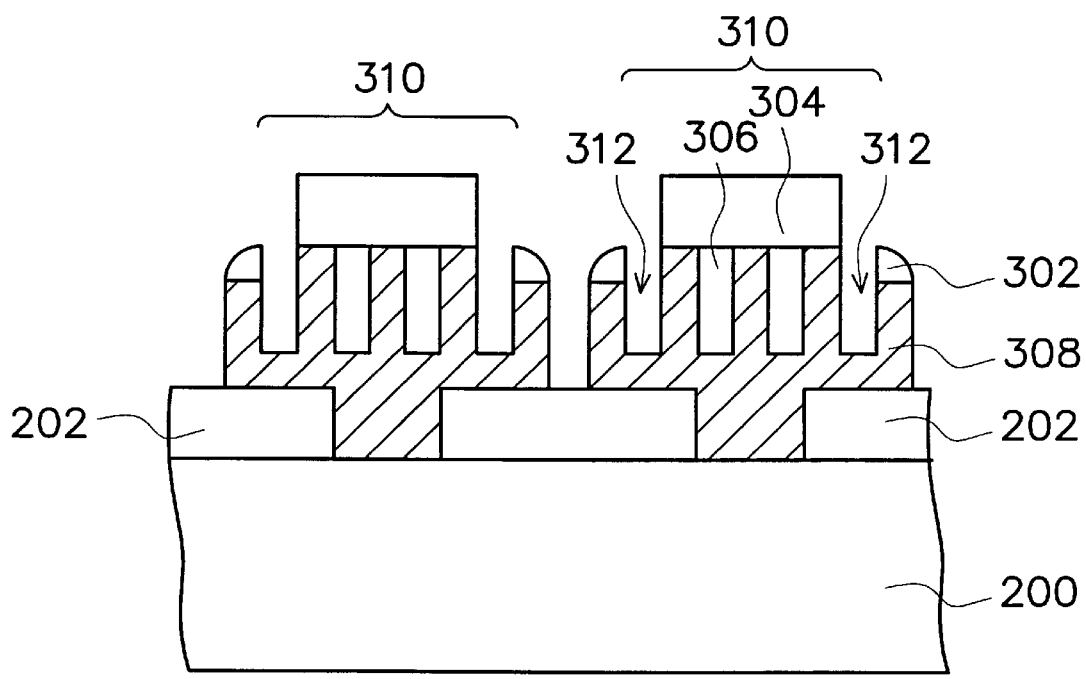

Referring to FIG. 3B, a wider photoresist layer 304 that is different from the one described above is formed to cover the oxide layer 306, the core conductive layer 308, and the ring conductive layer 308. However, the circumferential ring conductive layer 308 adjacent to the spacer 302 is exposed. With the photoresist layer 304 and the spacer 302 serving as masks, an etching step is further performed to form a hollow 312. The hollow 312, the oxide layer 306 and the remaining conductive layer 308 all together constitutes the capacitor region 310. Since the photoresist layer 304 covers the ring conductive layer 308, a part of the conductive layer 308 isolates the hollow 312 from the oxide layer 306.

Figure 3C:
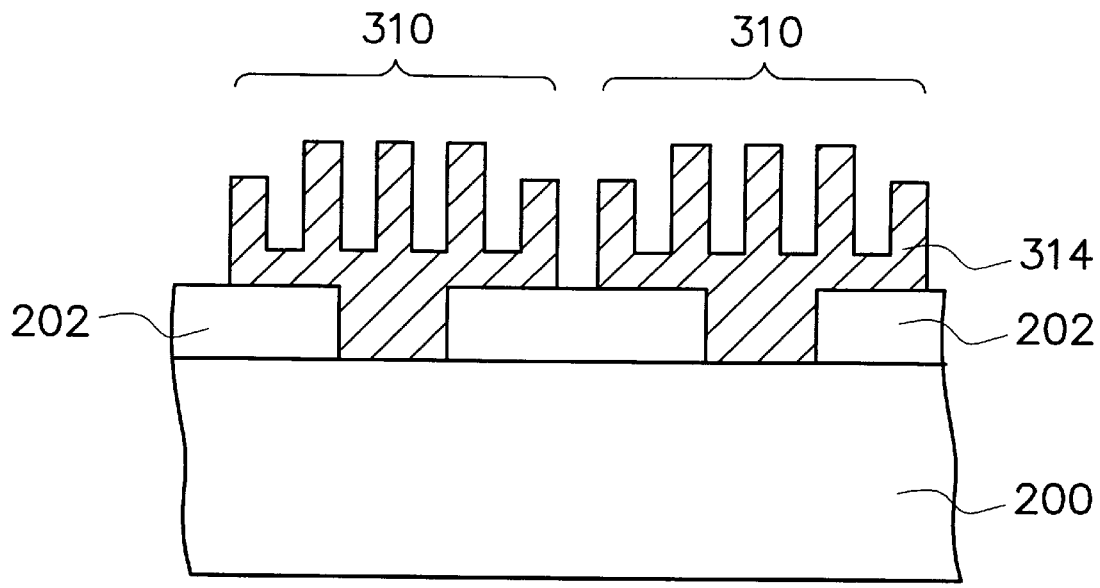

Referring to FIG. 3C the photoresist layer 304, the oxide layer 306, and the spacer 302 are removed to form the bottom electrode 314, wherein the core conductive layer of the bottom electrode 314 has a surface level higher than that of the circumferential ring conductive layer of the bottom electrode 314. Thus, the overall bottom electrode 314 formed has a fork-like structure in cross section.

Figure 3D:
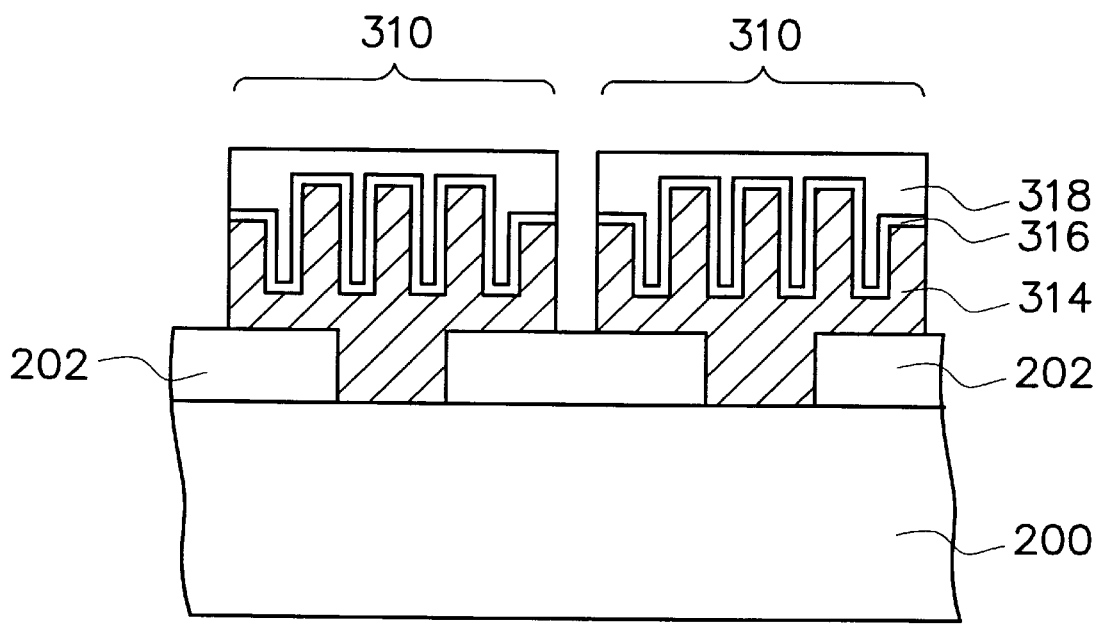

Referring to FIG. 3D, a dielectric layer 316 and an upper electrode 318 are formed in sequence on the bottom electrode 314 having a multiple concentric cylinder structure. This completes the manufacture of the capacitor in the invention.

The characteristic of the invention is to form the bottom electrode with a multiple concentric cylinder structure. In cases where the conductive layer does not need a great thickness, the surface area of the bottom electrode can be greatly increased. By this means, the capability for charge storage of the capacitor is increased, thus saving the capacitor process time and raising the velocity of capacitor production. In addition, since the thickness of the conductive layer is reduced, the bottom electrode does not produce a slim cylinder structure. Therefore, the breakage that leads to the poor quality of the capacitor in the subsequent processes is reduced to improve the process yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a DRAM capacitor, comprising steps of:

providing a substrate having a dielectric layer, wherein there is a node contact opening in the dielectric layer and the node contact opening exposes part of the substrate;

forming a conductive layer covering the dielectric layer and filling the node contact opening;

removing a part of the conductive layer to form an annulus hollow above the node contact, so that the core of the conductive layer is encompassed by the annulus hollow;

forming a thickness of the conductive layer over the dielectric layer, so that a ring of the conductive layer encompassing the annulus hollow is formed;

filling the annulus hollow with an oxide layer, and forming a spacer on a sidewall of the ring;

removing the ring of the conductive layer and the conductive layer over the dielectric layer with the spacer as a mask;

removing the oxide layer and the spacer to form a bottom electrode;

forming a dielectric layer on the bottom electrode; and covering the dielectric layer with a top electrode.

2. The fabricating method of claim 1, wherein the conductive layer has a thickness of about 3500–4500 Å.

3. The fabricating method of claim 1, wherein the step of forming the annulus hollow includes partial etching.

4. The fabricating method of claim 1, wherein the ring of the conductive layer and the conductive layer over the dielectric layer are removed by anisotropic etching.

5. The fabricating method of claim 4, wherein the anisotropic etching is performed with plasma made of $Cl_2$-based and HBr-based gases.

6. The fabricating method of claim 1, wherein the spacer includes an oxide layer.

7. A method of fabricating a bottom electrode, comprising the steps of:

providing a substrate having a dielectric layer, wherein there is a node contact opening in the dielectric layer, and the node contact opening exposes a part of the substrate;

forming a conductive layer to cover the dielectric layer and fill the node contact opening;

removing a part of the conductive layer to form an annulus hollow above the node contact, so that a core of the conductive layer is encompassed by the annulus hollow;

removing a thickness of the conductive layer over the dielectric layer to form a ring of the conductive layer encompassing the annulus hollow, wherein the core and the ring of the conductive layer having a surface higher than a surface of the conductive layer over the dielectric layer;

filling the annulus hollow with an oxide layer and forming a spacer on a sidewall of the ring of the conductive layer;

removing a portion of the ring of the conductive layer and the conductive layer over the dielectric layer with the spacer as a mask;

removing the oxide layer and the spacer to form a bottom electrode.

8. The fabricating method of claim 7, wherein the step of removing a portion of the ring of the conductive layer and the conductive layer over the dielectric layer comprising the steps of:

forming a photoresist layer to cover the oxide layer, the core of the conductive layer, and a portion of the ring of the conductive layer;

etching the conductive layer with the photoresist layer as a mask; and removing the photoresist layer.

9. The fabricating method of claim 7, wherein the conductive layer has a thickness of about 3500–4500 Å.

10. The fabricating method of claim 7, wherein the step of forming the annulus hollow includes partial etching.

11. The fabricating method of claim 7, wherein the step of removing a portion of the ring and the conductive layer over the dielectric layer includes anisotropic etching.

12. The fabricating method of claim 11, wherein the step of defining the capacitor region includes anisotropic etching with plasma made of $Cl_2$-based and HBr-based gases.

13. The fabricating method of claim 1, wherein the spacer includes an oxide layer.

* * * * *